United States Patent [19]
Gonzalez et al.

[11] Patent Number: 5,654,227
[45] Date of Patent: Aug. 5, 1997

[54] METHOD FOR LOCAL OXIDATION OF SILICON (LOCOS) FIELD ISOLATION

[75] Inventors: Fernando Gonzalez; Mike Violette, both of Boise, Id.

[73] Assignee: Micron Technology, Inc., Boise, Id.

[21] Appl. No.: 590,313

[22] Filed: Jan. 23, 1996

[51] Int. Cl.⁶ .................................................. H01L 21/76
[52] U.S. Cl. ........................ 438/439; 438/699; 438/702
[58] Field of Search ............................... 437/69, 70, 72, 437/73, 89, 61

[56] References Cited

U.S. PATENT DOCUMENTS

| | | |
|---|---|---|
| 4,462,846 | 7/1984 | Varshney .................................. 437/69 |
| 4,818,235 | 4/1989 | Chao ....................................... 437/69 |
| 4,968,641 | 11/1990 | Kalnitsky et al. ...................... 437/69 |
| 5,212,111 | 5/1993 | Doan et al. . |
| 5,215,935 | 6/1993 | Nagao ...................................... 437/69 |
| 5,266,523 | 11/1993 | Manning . |
| 5,358,892 | 10/1994 | Rolfson . |
| 5,393,694 | 2/1995 | Mathews . |
| 5,405,788 | 4/1995 | Manning et al. . |

FOREIGN PATENT DOCUMENTS

| | | | |
|---|---|---|---|
| 0251640 | 12/1985 | Japan .................................... | 437/70 |
| 0159240 | 7/1991 | Japan .................................... | 437/70 |
| 0280429 | 12/1991 | Japan .................................... | 437/70 |

*Primary Examiner*—Trung Dang

[57] ABSTRACT

A method for forming field oxide comprises the steps of forming a pad oxide layer over a semiconductor substrate, then forming a silicon layer over the pad oxide layer. A patterned mask is formed over the silicon layer and the silicon layer is etched to form openings in the silicon layer. Next, a blanket nitride layer is formed over the silicon and within the openings, and the nitride layer is then planarized to remove the nitride which overlies the silicon which leaves the nitride in the openings. Subsequent to the step of planarizing the nitride, the silicon layer is removed thereby forming openings in the nitride layer. The substrate is oxidized at the openings in the nitride layer to form field oxide from the substrate.

29 Claims, 2 Drawing Sheets

METHOD FOR LOCAL OXIDATION OF SILICON (LOCOS) FIELD ISOLATION

FIELD OF THE INVENTION

This invention relates to the field of semiconductor manufacture, and more particularly to a method for forming an isolation layer such as field oxide over a substrate such as silicon.

BACKGROUND OF THE INVENTION

Current methods of semiconductor manufacture comprise a process known as "LOCOS," or local oxidation of silicon. Various LOCOS and LOCOS-related processes are described in the following US Patents, each of which is assigned to Micron Technology, Inc. and incorporated herein by reference: U.S. Pat. No. 5,212,111 to Doan, et al; U.S. Pat. No. 5,266,523 to Manning; U.S. Pat. No. 5,358,892 to Rolfson; U.S. Pat. No. 5,393,694 to Mathews; and U.S. Pat. No. 5,405,788 to Manning, et at. With a typical LOCOS process, a thin "pad oxide" layer is formed over a typically silicon substrate, and a patterned nitride layer such as silicon nitride is formed over the pad oxide. The surface of the substrate is then exposed to oxidizing agents. As the formation of oxide under the nitride is inhibited, the substrate oxidizes to form a thicker oxide only in those areas of the substrate uncovered by the nitride. Some encroachment or "bird's beak" under the nitride can also occur which becomes more of a problem as line widths decrease. As line widths decrease, encroachment decreases the width of a channel under a transistor gate to a greater percentage than with a larger device having wider line widths.

Various steps have been taken to decrease encroachment. For example, because thicker pad oxide under the nitride encourages encroachment the pad oxide thickness is decreased. The pad oxide must be thick enough, however, to protect the substrate during formation of the patterned nitride. If the pad oxide is too thin, it can be completely removed in some areas of the substrate when a blanket nitride layer is etched to form the patterned layer and then the silicon substrate will begin to be etched. Etching the silicon is to be avoided as later oxidation of previously etched and pitted substrate forms defects in the silicon which degrades integrated circuit (IC) electrical characteristics.

A process which allows for a thin pad oxide to decrease encroachment and is less susceptible to damaging the substrate from an excessively thin pad oxide would be desirable.

SUMMARY OF THE INVENTION

One embodiment of a method for forming a semiconductor device comprises the steps of forming a first layer over a substrate, then forming a patterned second layer having openings over the first layer and over the substrate. A patterned second layer having openings is formed over the first layer and over the substrate, and a patterned third layer is formed at the openings of the second layer. The patterned second layer is removed and the third layer, which has openings therein, remains.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

One embodiment of the invention is described in FIGS. 1–5. A method for forming a semiconductor device comprises the steps of forming a first layer 10 such as a dielectric of pad oxide over a substrate 12 such as silicon. A pad oxide about 120 angstroms (Å) or less, for example about 60 Å, would be sufficient although other thicknesses would be possible. Various substrates other than a wafer substrate are possible, such as to form contacts to other layers, in which case the pad oxide may not be required.

Figure 2:
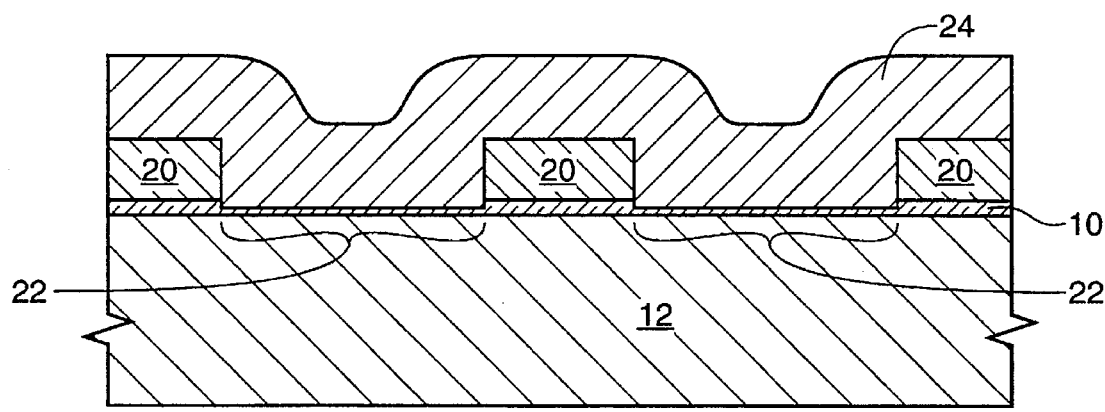

A blanket sacrificial second layer 14, for instance doped or undoped polycrystalline silicon is formed over the first layer 10 and over the substrate 12. A patterned photoresist layer 16 is formed over the blanket sacrificial layer 14, then a vertical (isotropic) etch is performed to pattern the blanket second layer 14 to result in the patterned second layer 20 as shown in FIG. 2. The second layer 20 comprises openings 22 therein resulting from being patterned. A sacrificial layer of about 2500 Å or less would be sufficient.

Subsequently, a blanket third layer 24 is formed over the sacrificial layer 20 at the openings 22 of the second layer 20. The third layer 24, such as an oxidation-resistant layer of silicon nitride, is planarized using a method such as chemical mechanical polishing (CMP) or other means. This results in the structure of FIG. 3 having a patterned third layer 30 formed at the openings 22 of the second layer 20. The sacrificial second layer 20 may also be etched somewhat to result in sacrificial and oxidation-resistant layers which are about 1900 Å thick, although other thicknesses would be sufficient.

Figure 4:
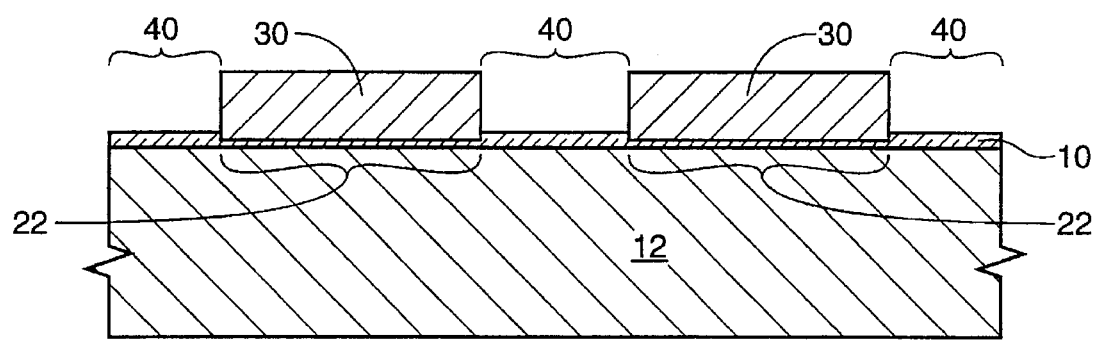

Next, at least a portion of the patterned second layer 20 is removed as shown in FIG. 4, for example by using a wet etch. At least a portion of the patterned third layer 30 remains and has openings therein 40 as shown. The openings 40 in the third layer 30 in this embodiment result from the removal of the second layer, although other means of forming the openings may be possible. Subsequent to removing the second layer an insulation material 50 is formed from portions of the substrate 12 which are uncovered by the patterned third layer 30, for example by oxidizing the substrate to form field oxide. If any of the first layer 10 remains, the portions of the first layer uncovered by the third layer are also consumed during the oxidation process.

Figure 1:
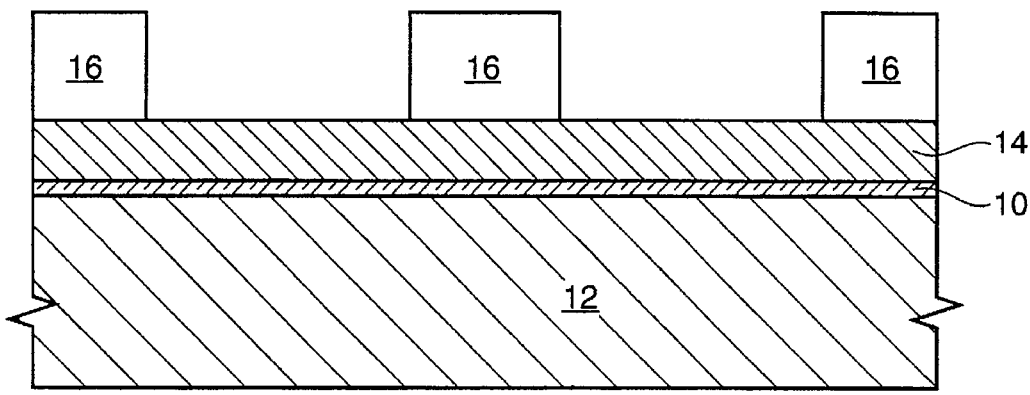
FIGS. 1–5 are cross sections showing various steps during one inventive embodiment of the invention.
Figure 5:
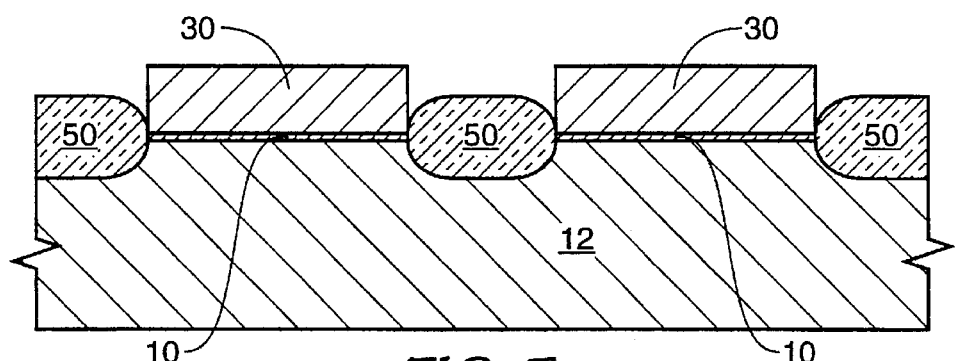
Figure 6:
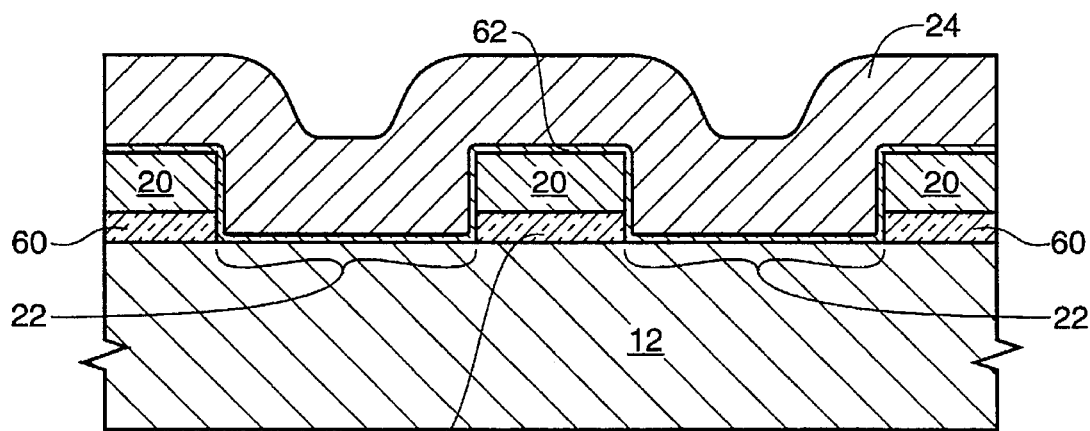
FIG. 6 is an intermediate step in a second embodiment of the invention.

The pad oxide must be thick enough to minimize any etching of the substrate during patterning of the second layer (the poly layer) during the etch of the FIG. 1 structure. However, a thick oxide is to be avoided during the formation of the insulation material as shown in FIG. 5 as a thick oxide under the third layer encourages encroachment of the field oxide under the third layer. In an alternate embodiment as shown in FIG. 6 a thick first layer 60 (pad oxide), for example a layer about 60 Å or greater, can be formed which is removed from the openings 22 during the etch of layer 20. A portion of the first layer 60 remains after the etch and is covered by the second layer 20. Before forming the third layer, a thin oxide layer 62 such as a thermal oxide layer of about 30 Å or greater is formed at the openings 22 of the second layer 20. This layer 62 is thinner than the pad oxide 60. The third layer 24 is formed over this oxide layer 62, and the wafer processing continues by planarizing the third layer 24. This allows for a thick pad oxide 10 to protect the substrate surface as the second layer is etched, but allows for a thin oxide 62 under the third layer 24 during the formation of the field oxide to minimize encroachment of the field oxide under the third layer.

Figure 3:
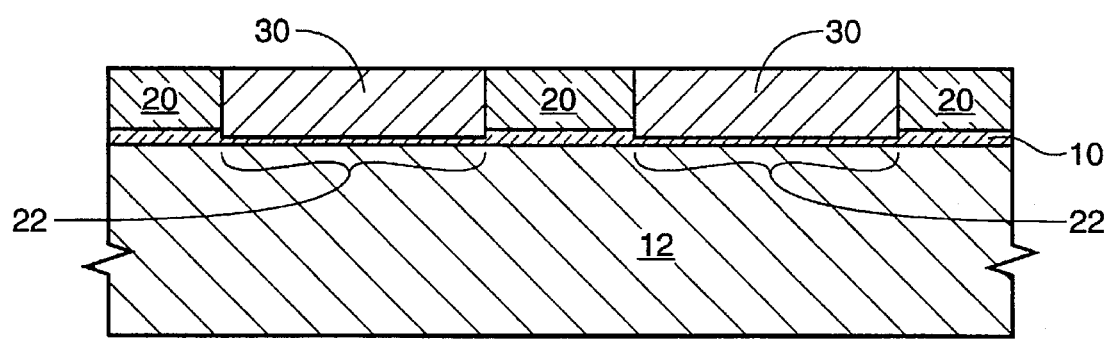

In yet another embodiment, referring to FIG. 3, an oxidizible layer 20 such as a poly layer is not removed but is instead oxidized to result in a structure similar to that of FIG. 5. This, in effect, removes the conductive poly layer 20 while requiring one less etch step than the prior embodiments. This may form a very thick oxide layer, for example field oxide, but this embodiment may function sufficiently with some uses of the invention.

With the instant invention, the etch ratio of the second layer (for example poly) to the first layer (pad oxide) is higher than the etch ratio of the third layer (nitride) to the first layer. For example, the etch ratio of polycrystalline silicon to pad oxide is from about 12:1 to about 15:1 and the etch ratio of silicon nitride to pad oxide is from about 6:1 to about 8:1. The etch ratio of poly to pad oxide can be changed by doping the poly, and the etch ratio depends on the type of etch used. With prior processes, the nitride is etched with an anisotropic etch and it is more difficult to remove the nitride and to not overetch the pad oxide. Thus with prior processes a thicker pad oxide must be formed to ensure that the substrate is not etched, but a thicker pad oxide encouraged encroachment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, etches other than the ones described herein can be used, and planarizing may be accomplished by methods other than chemical mechanical polishing. Similarly, materials other than polycrystalline silicon and silicon nitride may be used. It is therefore contemplated that the appended claims will cover any such modifications or embodiments as fall within the true scope of the invention.

What is claimed is:

1. A method for forming a semiconductor device, comprising the following steps:
   a) forming a first layer over a substrate;
   b) forming a patterned second layer over said first layer and over said substrate, said second layer having openings therein;
   c) forming a patterned third layer at said openings of said second layer;
   d) removing said patterned second layer and leaving said patterned third layer, said third layer having openings therein;
   wherein an etch ratio of said second layer to said first layer is higher than an etch ratio of said third layer to said first layer.

2. The method of claim 1 wherein said first layer has a first thickness, further comprising the steps of:
   a) removing said first layer subsequent to said step of forming said patterned second layer and prior to forming said third layer;
   b) forming an oxide layer having a second thickness at said openings of said second layer, said second thickness being thinner than said first thickness.

3. The method of claim 1 wherein said openings in said third layer result from said removal of said second layer.

4. The method of claim 1 further comprising the step of: subsequent to said removal of said second layer, forming insulation material from portions of said substrate which are uncovered by said patterned third layer.

5. The method of claim 4 wherein said insulation material is field oxide.

6. The method of claim 4 further comprising forming insulation material from portions of said first layer which are uncovered by said patterned third layer.

7. A method for forming an insulation layer during the formation of a semiconductor device comprising the following steps:
   a) forming a dielectric layer over a semiconductor substrate;
   b) forming a patterned sacrificial layer over said dielectric layer, said sacrificial layer having openings therein;
   c) forming an oxidation-resistant layer over said sacrificial layer and within said openings;
   d) planarizing said oxidation-resistant layer to remove said oxidation-resistant layer which is over said sacrificial layer and leaving said oxidation-resistant layer in said openings;
   e) subsequent to said step of planarizing, removing said sacrificial layer thereby forming openings in said oxidation-resistant layer;
   f) forming an insulation layer from said substrate at said openings in said oxidation-resistant layer.

8. The method of claim 7 wherein said dielectric layer is equal to or less than 120 Å thick.

9. The method of claim 7 wherein said dielectric layer is about 60 Å thick.

10. The method of claim 7 wherein said sacrificial layer is equal to or less than 2500 Å thick.

11. The method of claim 7 wherein said planarizing step comprises chemical mechanical polishing and results in oxidation-resistant and sacrificial layers which are about 1900 Å thick.

12. The method of claim 7 wherein a first etch ratio of said sacrificial layer to said dielectric layer is higher than a second etch ratio of said oxidation-resistant layer to said dielectric layer.

13. The method of claim 12 wherein said first etch ratio is from about 12:1 to about 15:1, and said second etch ratio is from about 6:1 to about 8:1.

14. A method for forming field oxide comprising the following steps:
   a) forming a pad oxide layer over a semiconductor substrate;
   b) forming a silicon layer over said pad oxide layer;
   c) forming a patterned mask over said silicon layer;
   d) etching said silicon layer to form openings in said silicon layer;
   e) forming a blanket nitride layer over said silicon and within said openings;
   f) planarizing said nitride layer to remove said nitride which overlies said silicon and leaving said nitride in said openings;
   g) subsequent to said step of planarizing, removing said silicon layer thereby forming openings in said nitride layer;
   h) oxidizing said substrate at said openings in said nitride layer to form field oxide from said substrate.

15. The method of claim 14 wherein said pad oxide layer is equal to or less than 120 Å thick.

16. The method of claim 14 wherein said pad oxide layer is about 60 Å thick.

17. The method of claim 14 wherein said silicon layer is equal to or less than 2500 Å thick.

18. The method of claim 14 wherein said planarizing step comprises chemical mechanical polishing and results in nitride and silicon layers which are about 1900 Å thick.

19. The method of claim 14 wherein a first etch ratio of said silicon layer to said pad oxide layer is higher than a second etch ratio of said nitride layer to said pad oxide layer.

20. The method of claim 19 further comprising the step of doping said silicon layer to increase said first etch ratio.

21. The method of claim 19 wherein said first etch ratio is from about 12:1 to about 15:1, and said second etch ratio is from about 6:1 to about 8:1.

22. A method for forming field oxide during the formation of a semiconductor device comprising the following steps:

a) forming a dielectric layer over a semiconductor substrate;

b) forming a patterned oxidizable layer over said dielectric layer, said oxidizible layer having openings therein;

c) forming an oxidation-resistant layer over said oxidizible layer and within said openings;

d) planarizing said oxidation-resistant layer to remove said oxidation-resistant layer which is over said oxidizible layer and leaving said oxidation-resistant layer in said openings;

e) subsequent to said step of planarizing, oxidizing said oxidizible layer thereby forming field oxide from said oxidizible layer.

23. The method of claim 22, further comprising the step of removing said oxidation-resistant layer subsequent to said step of oxidizing said oxidizible layer.

24. A method for forming a semiconductor device, comprising the following steps:

forming a first layer having a first thickness over a substrate;

forming a patterned second layer over said first layer and over said substrate, said second layer having openings therein;

forming an oxide layer having a second thickness at said openings of said second layer, said second thickness being thinner than said first thickness.

subsequent to said step of forming said patterned second layer, removing said first layer;

subsequent to removing said first layer, forming a patterned third layer at said openings of said second layer;

removing said patterned second layer and leaving said patterned third layer, said third layer having openings therein.

25. The method of claim 24 wherein said openings in said third layer result from said removal of said second layer.

26. The method of claim 24 further comprising the step of:

subsequent to said removal of said second layer, forming insulation material from portions of said substrate which are uncovered by said patterned third layer.

27. The method of claim 26 wherein said insulation material is field oxide.

28. The method of claim 26 further comprising forming insulation material from portions of said first layer which are uncovered by said patterned third layer.

29. The method of claim 24 wherein an etch ratio of said second layer to said first layer is higher than an etch ratio of said third layer to said first layer.

* * * * *

UNITED STATES PATENT AND TRADEMARK OFFICE
CERTIFICATE OF CORRECTION

PATENT NO. : 5,654,227
DATED : August 5, 1997
INVENTOR(S) : Gonzalez et al.

It is certified that error appears in the above-identified patent and that said Letters Patent is hereby corrected as shown below:

Column 2, line 20, please delete "(isotropic)" and replace with -- anisotropic -- .

Signed and Sealed this

Thirtieth Day of December, 1997

Attest:

BRUCE LEHMAN

Attesting Officer

Commissioner of Patents and Trademarks